(12) United States Patent
Chan et al.

(10) Patent No.: US 7,233,528 B2
(45) Date of Patent: Jun. 19, 2007

(54) REDUCTION OF PROGRAMMING TIME IN ELECTRICALLY PROGRAMMABLE DEVICES

(75) Inventors: Johnny Chan, Fremont, CA (US); Jeffrey Ming-Hung Tsai, San Jose, CA (US); Tin-Wai Wong, Fremont, CA (US)

(73) Assignee: Atmel Corporation, San Jose, CA (US)

( * ) Notice: Subject to any disclaimer, the term of this patent is extended or adjusted under 35 U.S.C. 154(b) by 164 days.

(21) Appl. No.: 11/188,612

(22) Filed: Jul. 25, 2005

(65) Prior Publication Data

US 2007/0019471 A1    Jan. 25, 2007

(51) Int. Cl.
*G11C 16/04*    (2006.01)

(52) U.S. Cl. .......................... 365/185.28; 365/185.18; 365/185.33

(58) Field of Classification Search ............ 365/185.28
See application file for complete search history.

(56) References Cited

U.S. PATENT DOCUMENTS

| | | | |
|---|---|---|---|
| 5,430,674 A * | 7/1995 | Javanifard | 365/185.1 |
| 5,537,350 A * | 7/1996 | Larsen et al. | 365/185.33 |
| 6,157,573 A | 12/2000 | Ishii et al. | 365/185.24 |
| 6,246,612 B1 | 6/2001 | Van Houdt et al. | 365/185.296 |
| 6,295,228 B1 | 9/2001 | Pawletko et al. | 365/185.22 |
| 6,314,025 B1 | 11/2001 | Wong | 365/185.22 |
| 6,392,932 B1 | 5/2002 | Ishii et al. | 365/185.24 |
| 6,418,059 B1 * | 7/2002 | Kreifels et al. | 365/185.28 |
| 6,426,894 B1 | 7/2002 | Hirano | 365/185.18 |
| 6,434,052 B1 | 8/2002 | Son et al. | 365/185.23 |
| 6,452,838 B1 | 9/2002 | Ishii et al. | 365/185.24 |
| 6,473,341 B1 | 10/2002 | Gomiero et al. | 365/185.28 |
| 6,542,410 B2 | 4/2003 | Hirano | 365/185.3 |
| 6,542,411 B2 | 4/2003 | Tanikawa et al. | 365/185.33 |
| 6,567,315 B2 | 5/2003 | Takase et al. | 365/185.28 |
| 6,567,319 B2 | 5/2003 | Sato et al. | 365/189.09 |
| 6,587,381 B2 | 7/2003 | Kanai et al. | 365/185.28 |
| 6,606,267 B2 | 8/2003 | Wong | 365/185.22 |
| 6,614,715 B2 | 9/2003 | Tsao et al. | 365/238.5 |
| 6,621,737 B2 | 9/2003 | Naura et al. | 365/185.18 |
| 6,633,494 B2 | 10/2003 | Roohparvar et al. | 363/60 |
| 6,653,682 B1 | 11/2003 | Houdt et al. | 257/315 |
| 6,661,724 B1 | 12/2003 | Snyder et al. | 365/211 |
| 6,680,868 B2 | 1/2004 | Akamatsu | 365/189.04 |
| 6,683,810 B2 | 1/2004 | Sakamoto | 365/185.22 |
| 6,683,811 B2 | 1/2004 | Ishii et al. | 365/185.24 |
| 6,687,159 B2 | 2/2004 | Pasotti et al. | 365/185.18 |
| 6,747,893 B2 | 6/2004 | Uribe et al. | 365/185.03 |
| 6,751,118 B2 | 6/2004 | Tran et al. | 365/185.03 |
| 6,754,103 B2 | 6/2004 | Frayer | 365/185.03 |
| 6,771,544 B2 | 8/2004 | Yoshida | 365/185.28 |
| 2006/0077720 A1* | 4/2006 | Im | 365/185.28 |

* cited by examiner

*Primary Examiner*—Son L. Mai
(74) *Attorney, Agent, or Firm*—Schneck & Schneck; Thomas Schneck

(57) ABSTRACT

A flash memory programming process incorporates two charge pumps per byte of bit cells. Placing a data "one" value in each bit cell erases an entire memory device. Before programming each cell, a prospective data content is scrutinized. If a data "zero" is to be applied to the bit cell, a charge pump engages to bias the cell and activate a hot electron injection process to affect the programming. If a data "one" is to be applied to the bit cell, no programming activity is undertaken and the process increments to the next bit cell in the data structure. Therefore, total programming time is reduced proportionally to the number of data "one" bits to be programmed. Where more than one charge pump is engaged in parallel to a data structure, total programming time is further reduced when two data "one" values are to be programmed in parallel.

17 Claims, 3 Drawing Sheets

|  | $t_1$ | $t_2$ | $t_3$ | $t_4$ |
|---|---|---|---|---|
| CP1 | BIT(7) | BIT(6) | BIT(5) | BIT(4) |
| CP2 | BIT(3) | BIT(2) | BIT(1) | BIT(0) |

Fig._ 4a

|  | $t_1$ | $t_2$ | $t_3$ | $t_4$ |
|---|---|---|---|---|
| CP1 | BIT(7) | BIT(5) | BIT(3) | BIT(1) |
| CP2 | BIT(6) | BIT(4) | BIT(2) | BIT(0) |

Fig._ 4b

REDUCTION OF PROGRAMMING TIME IN ELECTRICALLY PROGRAMMABLE DEVICES

TECHNICAL FIELD

The present invention relates to programming electrically programmable devices. More particularly, the invention relates to a method for determining programming of data based on an input data value.

BACKGROUND ART

Semiconductor memory devices are typically classified into volatile memory devices and non-volatile memory devices. Volatile memory devices are subdivided into dynamic random access memories (DRAMs) and static random access memories (SRAMs). Non-volatile memory types include mask read-only memories (MROMs), programmable read-only memories (PROMs), erasable programmable read-only memories (EPROMs), and electrically erasable programmable read-only memories (EEPROMs). Additionally, flash EEPROMs are advantageous as mass storage devices because their integration density is high compared with conventional EEPROMs.

Non-volatile semiconductor memories have attained broad utilization due to an ability to retain data within a device, even after power has been suspended. EEPROMs are non-volatile semiconductor memories that possess these abilities and additionally are able to store data by electrically erasing and writing storage devices. This programming process can be repeated over hundreds of thousands of cycles.

A flash memory is a type of non-volatile memory where all bit cells or pages of bit cells are erased simultaneously to a logic one or logic zero level before programming occurs. A bit cell is programmed by hot electron injection (HEI). Each bit cell of the flash memory is erased by tunneling of electrons through a thin tunnel diode window from a conductive channel to a floating polysilicon gate. The bit cell contains a select transistor and a sense or memory transistor. With an NMOSFET device used for the memory transistor, erasure produces a logic level of "1" in the cell. A PMOSFET memory transistor produces a complementary result.

A charge pump is used for generating the voltages required for programming the bit cells of the flash memory. The size of a charge pump on a substrate is large due to the size of a typical capacitor used and the number of stages of capacitors required. It is desirable to keep the number of charge pumps per byte small in order to save space on the substrate due to the relatively large size of each charge pump.

Programming of a bit cell takes one programming time, $t_p$. A charge pump programs one bit cell at a time. For the NMOSFET-type memory device, programming (writing) each bit cell involves setting the cell to a "0" logic level by biasing the cell with a charge pump and inducing hot electron injection for the programming time, $t_p$. In a bit cell to be programmed to a logic level "1," no programming is required. The initial bulk erasing operation places each bit cell into a "1" logic level condition by default.

One or more charge pumps may engage a particular data structure. For instance, two charge pumps may be associated with a byte of data at a time. A total time for programming a data structure is given by $$\frac{BC \times t_p}{CP},$$

where BC is a number of bit cells in the data structure, $t_p$ is an amount of time for programming one bit cell, and CP is a number of charge pumps engaged in programming the data structure. For example, in the case of programming a single byte data structure with two charge pumps, the total programming time is equal to $$\frac{8 \times 3\,\text{msec}}{2}$$

or 12 milliseconds (msec) where the programming time, $t_p$, for a single bit cell is 3 msec.

With reference to FIG. 1, a prior art process flow diagram 100 of a single charge pump programming a byte wide data structure commences with writing 110 Bit(7), where a bit cell index, i, equals 7. The process continues with writing 120 Bit(6) and continues through each bit position of the byte by decrementing the bit cell index, i, by one to engage each successive bit cell location. The process continues until reaching the step of writing 180 Bit(0). The process concludes with ending 190 the flow. The programming time for this process is $8 \times t_p$, where there are eight bit cells (BC=8) for the byte data structure and one charge pump (CP=1).

With reference to FIG. 2, a prior art process flow diagram 200 for two charge pumps programming a byte wide data structure commences with writing 210 Bits(7, 6), where a bit cell pair index, i:j, equals 7, 6. The process continues with writing 220 Bits(5, 4) and continues through bit pairs of the byte by decrementing each element of the bit cell pair index by two. The process continues until reaching the step of writing 240 Bits(1, 0). The process concludes with ending 250 the flow. A programming time for the dual charge pump process, substituting the prior art values into the expression given supra, is $$\frac{8 \times t_p}{2}$$

or $4 \times t_p$.

However, the direct approach of the prior art of engaging the charge pumps to the data structure does not take into account any correlation of a logic level set by the initial erasing of the bit cells and a logic level to be programmed. A direct programming approach applies an equal programming time per bit cell regardless of the final logic level of programmed data. A device not taking into account a lack of required programming for one gender of input data is expending programming time with no effective programming transpiring. This lack of effective programming happens with each occurrence of an input data value equaling the erased logic level. It would be ideal if a device would take into account the gender of data to be programmed and skip the programming of bit cell locations with an erased logic level equal to the gender of data to be programmed. Combining data gender coordinated programming with an ability to engage multiple charge pumps would truncate overall programming time in proportion to the amount of data equal to the logic level of the erased bit cells.

SUMMARY

A process of programming a flash memory device incorporates, for example, two charge pumps per byte of bit cells to be programmed. In an exemplary embodiment, the entirety of bit cells in the device is first erased. Erasure of a bit cell places the cell in a data "one" value. As the programming process progresses through the cells, a data content to be applied to the cell is scrutinized. If a data "zero" condition is to be applied to the bit cell, a charge pump is engaged to bias the cell and activate a hot electron injection process to affect the programming. If a data "one" value is to be applied to the bit cell, no programming activity is undertaken and the process increments to the next bit cell to be programmed and one bit cell programming time is saved. In this way total programming time is reduced in direct proportion to the number of data "one" bits to be programmed. Where more than one charge pump is engaged in parallel to a data structure, a further reduction in total programming time is realized with each pair of data "one" values occurring in parallel.

BRIEF DESCRIPTION OF DRAWINGS

FIGS. 4a and 4b are exemplary bit sequence programming arrays for a two charge pump approach to programming an electrically programmable device.

DETAILED DESCRIPTION

Figure 1:
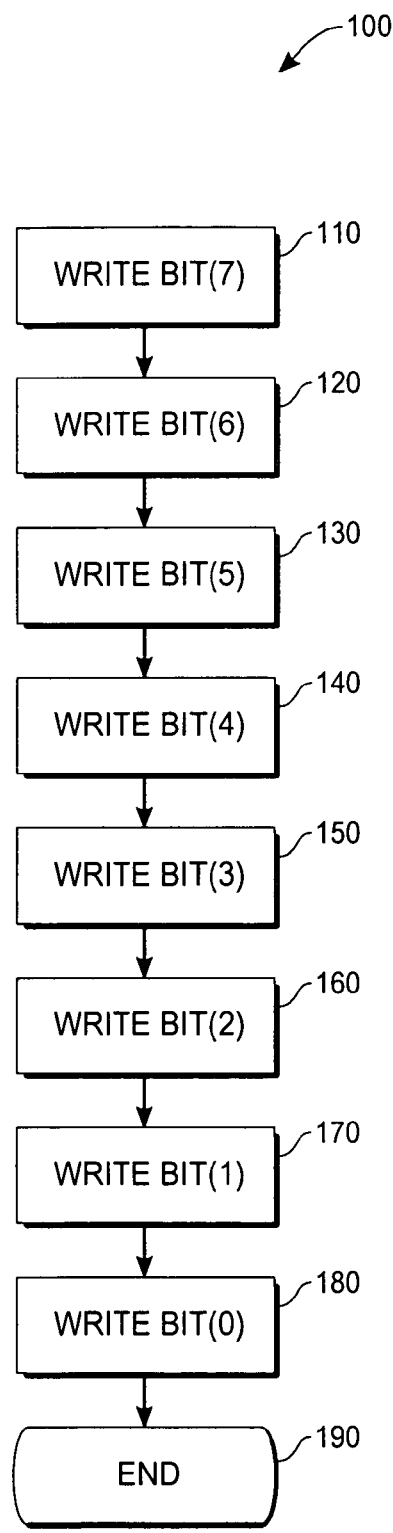
FIG. 1 is a prior art process flow diagram of programming a byte wide data structure with a single charge pump.
Figure 2:
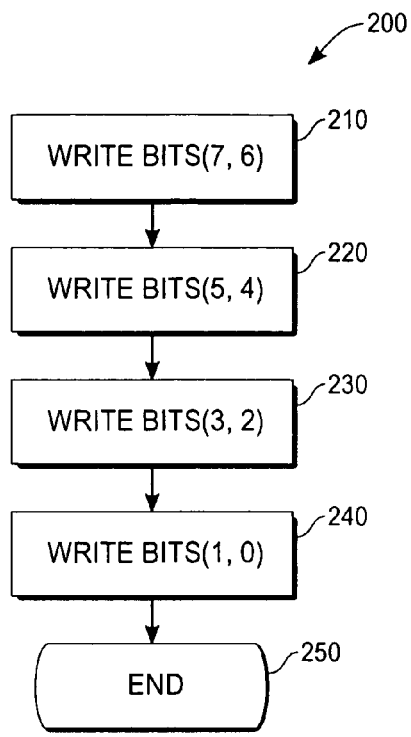
FIG. 2 is a prior art process flow diagram of programming a byte wide data structure with two charge pumps.
Figure 3:
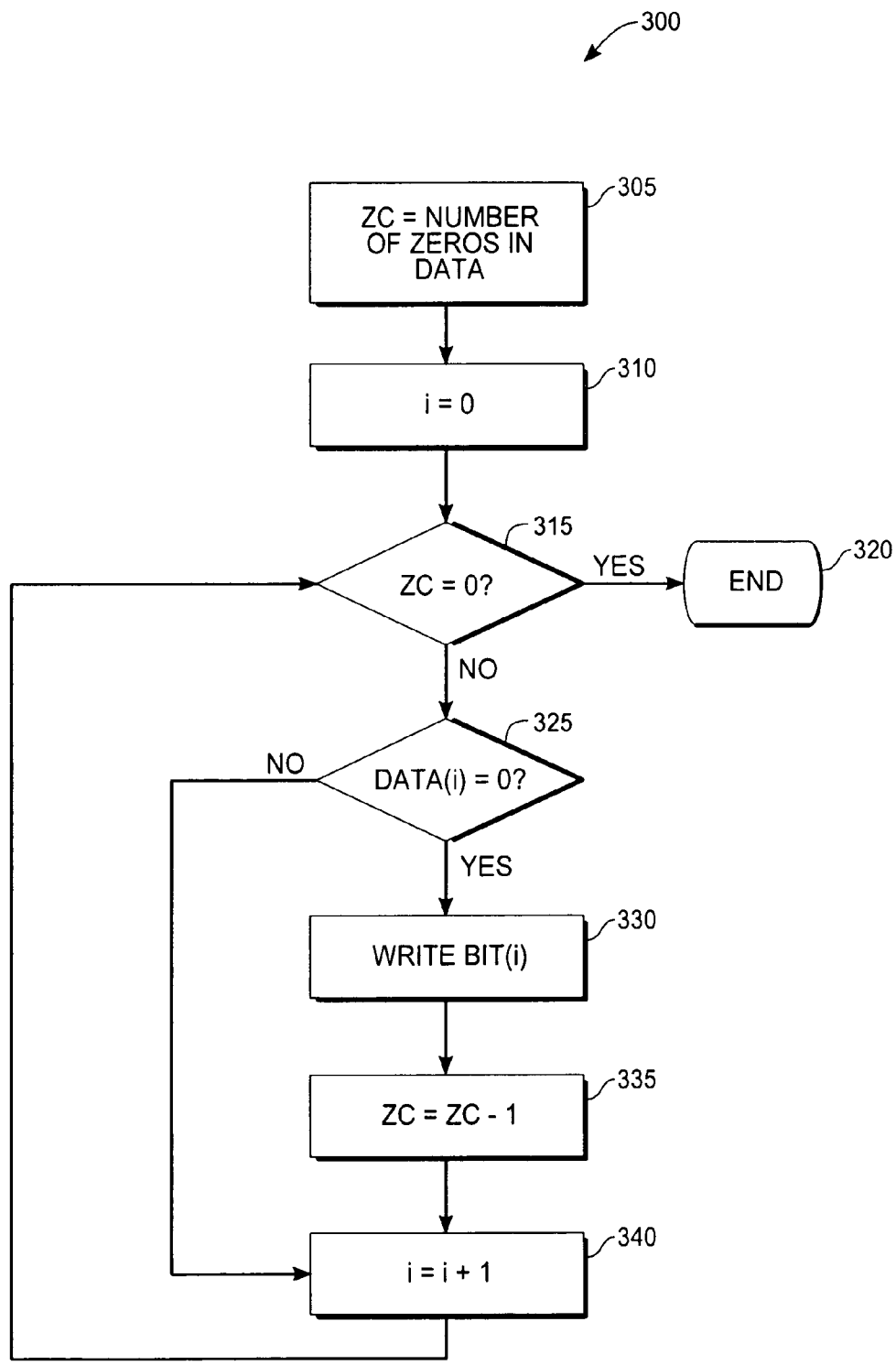
FIG. 3 is a process flow diagram of an exemplary method of programming a memory cell data content based on data value.

With reference to FIG. 3, an exemplary process flow diagram 300 of a data content based programming method, commences with setting 305 the variable test quantity, ZC, equal to the number of zeros in a sequence of input data to be stored. The method continues with setting 310 an index, i, equal to zero and determining 315 if ZC is equal to zero. If ZC is equal to zero, the process ends 320. If ZC is not equal to zero, a determination 325 is made whether an $i^{th}$ data bit is equal to zero. If the $i^{th}$ data bit is not equal to zero, a step of incrementing 340 the index, i, by one is made. If the $i^{th}$ data bit is equal to zero, a next step of writing 330 the $i^{th}$ data bit to a respective bit cell is taken and a step of decrementing 335 ZC by one is taken. The process flow continues with the step of incrementing 340 the index, i, by one, as described supra. A next step is determining 315 if ZC is equal to zero with the incremented index, i, and subsequently proceeding as described supra. The total amount of programming time for a byte data structure, per the exemplary process flow, is given by $$\frac{\% \ zeros \times BC \times t_P}{CP},$$

where % zeros is the percentage of zeros (expressed as a decimal) in the sequence of input data.

With reference to FIG. 4a, a first exemplary bit cell programming sequence array 405, two charge pump programming rows CP1, CP2 are labeled on the ordinate with four programming time slots $t_1$–$t_4$ sequenced along the abscissa. Each programming time slot signifies a duration of programming time equal to $t_p$. A first charge pump CP1 programs Bit(7) in a first programming time slot $t_1$, Bit(6) in a second programming time slot $t_2$, Bit(5) in a third programming time slot $t_3$, and Bit(4) in a fourth programming time slot $t_4$. A second charge pump CP2 programs Bit(3) through Bit(0) in the same sequence of four programming time slots $t_1$–$t_4$. Each of the two charge pumps CP1, CP2 sequences through the four bit cell programming stages during the four respective programming time slots $t_1$–$t_4$. For either charge pump, a data "one" value to be programmed by the data content programming method (FIG. 3), described supra, means that the respective programming time slot may be skipped; saving one programming time, $t_p$. With each charge pump operating independently, any sequence of zeros may be operated on with the greatest optimization of data "one" contents within the input data sequence and minimizes an overall programming time for the data structure.

For instance, a data byte with a value 10111000, engaged with the bit cell programming sequence above (FIG. 4a), would have the first charge pump CP1 programming the sequence 1011 and the second charge pump CP2 programming the sequence 1000 in parallel. The first charge pump CP1 requires one programming time slot $t_p$ to program the single zero within the input data sequence. The second charge pump CP2 requires three programming time slots or $3 \times t_p$ to program the three zeros in the input data. A limiting factor in bit cell programming optimization, therefore, is the number of zeros in the input data for a given charge pump.

In a further example, a data byte with a value 10010011 has an equal number of zeros to program for each charge pump CP1, CP2. The first charge pump CP1 programs the sequence 1001 and the second charge pump CP2 programs the sequence 0011. The total amount of programming time, using the expression $$\frac{\% \ zeros \times BC \times t_P}{CP},$$

is equal to $$\frac{0.5 \times 8 \times t_P}{2}$$

or $2 \times t_p$, where $t_p$ is the programming time for one bit cell. Therefore, both charge pumps CP1, CP2 finish programming at the same time and finish in half the time of a conventional bit cell programming sequence.

With reference to FIG. 4b, a second exemplary bit cell programming sequence array 415, two charge pump programming rows CP1, CP2 are labeled on the ordinate with four programming time slots $t_1$–$t_4$ sequenced along the abscissa. Each programming time slot signifies a programming duration equal to $t_p$. A first charge pump CP1 programs Bit(7) in a first programming time slot $t_1$, Bit(5) in a second programming time slot $t_2$, Bit(3) in a third programming time slot $t_3$, and Bit(1) in a fourth programming time slot $t_4$. A second charge pump CP2 programs Bit(6) through Bit(0) in the same sequence of four programming time slots $t_1$–$t_4$. Each of the two charge pumps CP1, CP2 sequences through the four bit cell programming stages during the four respective programming time slots $t_1$–$t_4$. For either charge pump, a data "one" value programmed by the data content programming method (FIG. 3), described supra, means that the respective programming time slot may be skipped; saving one programming time, $t_p$. With each charge pump operating independently, any sequence of zeros may be operated on with the greatest optimization of data "one" content within the input data sequence and minimizes an overall programming time for the data structure.

For instance, a data byte with a value 10111000, engaged with the bit cell programming sequence above (FIG. 4b), would have the first charge pump CP1 programming the sequence 1110 and the second charge pump CP2 programming the sequence 0100 in parallel. The first charge pump CP1 requires one programming time slot $t_p$ to program the single zero within the input data sequence. The second charge pump CP2 requires three programming time slots or $3 \times t_p$ to program the three zeros in the input data. A limiting factor in bit cell programming optimization, therefore, is the number of zeros in the input data for a given charge pump.

In a further example, a data byte with a value 10010011 has an equal number of zeros to program for each charge pump CP1, CP2. The first charge pump CP1 programs the sequence 1001 and the second charge pump CP2 programs the sequence 0101. The total amount of programming time, using the expression $$\frac{\% \text{ zeros} \times BC \times t_P}{CP},$$

is equal to $$\frac{0.5 \times 8 \times t_P}{2}$$

or $2 \times t_p$, where $t_p$ is the programming time for one bit cell. Therefore, both charge pumps CP1, CP2 finish programming at the same time and finish in half the time of a conventional bit cell programming sequence.

From the two examples cited above (FIGS. 4a, 4b), two different bit cell programming sequences 405, 415 produce the same net total programming time when two charge pumps engage the same data byte value. An artisan would appreciate that certain data structures may contain a predetermined distribution or a probability distribution (or density) function (PDF) of occurrences of ones or zeros within certain fields of a data structure or data word. For instance, a microprocessor architecture may have a particular distribution of opcodes and operand encodings within an instruction set encoding scheme. The distribution of encodings may accentuate a number of ones or zeros within a particular field or subfield within each instruction word across a range of storage locations. When an electrically programmable storage device is matched to a data structure with a known probability distribution function within subfields, a bit cell programming sequence may be crafted to optimize a total programming time of the device.

A person skilled in the art would also readily identify a similar situation occurring within the probability distribution of opcodes within the encodings of instructions for typical programming. For example, certain logical or arithmetic operations may occur more often than operations to test equivalence or to perform comparisons. The respective operations and their encodings therefore, will occur with different likelihood. A bit cell programming sequence may be tailored to optimize programming time in view of the distribution of encoding.

In a further example of operand encoding, a RISC processor targeted to operate with the C programming language, may also operate within a recommend procedural call standard (PCS). A PCS is employed to coordinate a conformity in register usage between calling and called program segments. The use of a PCS will specify a subset of registers to contain a finite set of operand locations. The instructions used at subprogram calls will have a limited set of register location (operand) encodings and therefore, a limited distribution of data within the operand subfield of storage instructions. The limited operand encodings make an opportunity for a bit cell programming sequencing approach similar to those presented supra. Knowing the distribution of the opcodes from typical programs would allow an artisan to tailor a bit cell programming sequence to optimize storage of such programs and reduce the total bit cell programming time.

While examples have been presented of matching bit cell programming sequences to particular data distribution probabilities, one skilled in the art would readily recognize that many different bit cell programming sequences may be incorporated to store the same data. The skilled artisan would also recognize that there may exist a probability of distribution in the data that will make certain selections of bit cell programming sequences more effective in reducing total bit cell programming time for a memory device. The exemplary embodiments contained herein should thus be considered in an illustrative rather than restrictive sense.

The invention claimed is:

1. A method of programming a nonvolatile electrically programmable device comprising:
   setting a count of zeros equal to a total number of zeros in a sequence of input data;
   indexing the sequence of input data;
   making a first determination whether a data content at a position indexed in the sequence of input data is equal to zero; and
   programming a bit cell location if the first determination is true that the data content is equal to zero.

2. The method of claim 1, further comprising:
   decrementing the count of zeros if the first determination is true that the data content is equal to zero; and
   incrementing the index of the position in the sequence of input data.

3. The method of claim 1, further comprising:
   making a second determination whether the count of zeros in the sequence of input data is equal to a defined value, the defined value being determined by a number of locations desired to be processed; and
   ending the programming if the second determination is true that the count of zeros is equal to the defined value.

4. The method of claim 1, further comprising saving a programming time of the bit cell location if the input data content is not equal to zero.

5. The method of claim 1, further comprising reducing an overall bit cell programming time by adding one or more charge pumps.

6. The method of claim 5, further comprising assigning a bit cell programming sequence of the two or more charge pumps based on an input data probability distribution function.

7. A method of programming a nonvolatile electrically programmable device comprising:

setting a count of ones equal to a total number of ones in a sequence of input data;

indexing the sequence of input data;

making a first determination whether a data content at the position indexed in the sequence of input data is equal to one; and programming a bit cell location if the first determination is true that the data content is equal to one.

8. The method of claim 7, further comprising;

decrementing the count of ones if the first determination is true that the data content is equal to one; and incrementing the index of the position in the sequence of input data.

9. The method of claim 7, further comprising:

making a second determination whether the count of ones is equal to a defined value, the defined value being determined by a number of locations desired to be processed; and ending the programming if the second determination is true that the count of ones is equal to the defined value.

10. The method of claim 7, further comprising saving a programming time of the bit cell location if the input data content is not equal to one.

11. The method of claim 7, further comprising reducing an overall bit cell programming time by adding one or more charge pumps.

12. The method of claim 11, further comprising assigning a bit cell programming sequence of the two or more charge pumps based on an input data probability distribution function.

13. A method of programming a nonvolatile electrically programmable device comprising:

ascertaining a count, the count indicating a quantity of data values of a first gender in a sequence of input data;

indexing the sequence of input data;

making a first determination whether a data content at the position indexed in the sequence of input data is equal to the first gender;

making a second determination whether the count is equal to a defined value, the defined value being determined by a number of locations desired to be processed;

programming a bit cell location if the first determination is true that the data content is equal to the first gender;

decrementing the count if the first determination is true that the data content is equal to the first gender; and incrementing the index of the position in the sequence of input data.

14. The method of claim 13, further comprising ending the programming if the second determination is true that the count of ones is equal to the defined value.

15. The method of claim 13, further comprising saving a programming time of the bit cell location if the input data content is not equal to the first gender.

16. The method of claim 13, further comprising reducing an overall bit cell programming time by adding one or more charge pumps.

17. The method of claim 16, further comprising assigning a bit cell programming sequence of the two or more charge pumps based on an input data probability distribution function.

* * * * *